(12) United States Patent
Uo (10) Patent No.: US 9,077,352 B2
(45) Date of Patent: Jul. 7, 2015

(54) CLOCK REGENERATION CIRCUIT, LIGHT RECEIVING CIRCUIT, PHOTOCOUPLER, AND FREQUENCY SYNTHESIZER

(71) Applicant: KABUSHIKI KAISHA TOSHIBA, Minato-ku, Tokyo (JP)

(72) Inventor: Toyoaki Uo, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 14/092,132

(22) Filed: Nov. 27, 2013

(65) Prior Publication Data
US 2014/0153935 A1 Jun. 5, 2014

(30) Foreign Application Priority Data

Nov. 30, 2012 (JP) ................. 2012-263207

(51) Int. Cl.
*H04B 10/06* (2006.01)
*H04L 7/00* (2006.01)
*H04L 25/00* (2006.01)
*H04L 25/40* (2006.01)
*H03L 7/183* (2006.01)
*H03L 7/081* (2006.01)
*H03L 7/095* (2006.01)
(Continued)

(52) U.S. Cl.
CPC ............... *H03L 7/183* (2013.01); *H04L 7/0037* (2013.01); *H03L 7/0816* (2013.01); *H03L 7/095* (2013.01); *H04L 7/033* (2013.01); *H04L 7/0337* (2013.01); *H04L 25/49* (2013.01)

(58) Field of Classification Search
CPC ...... H04B 10/66; H04B 10/67; H04B 10/671; H04B 10/675; H04B 10/69; H04B 10/691; H04B 10/693; H04B 10/6931; H04B 10/6932; H04B 10/695; H04B 10/697; H04B 10/6971; H04L 7/07; H04L 7/0807; H04L 7/033; H04L 7/007; H04L 7/807; H04L 7/0816; H04L 7/0037; H04L 27/156
USPC ................. 398/154, 155, 202–204, 208, 209; 375/238, 354, 359, 371, 374, 375, 364, 375/316, 326
See application file for complete search history.

(56) References Cited

U.S. PATENT DOCUMENTS

| 6,259,290 | B1 | 7/2001 | Takada et al. |
| 7,369,067 | B2 | 5/2008 | Kishi et al. |
| 8,188,777 | B2 | 5/2012 | Yamaguchi |

(Continued)

FOREIGN PATENT DOCUMENTS

| JP | 2006-246266 A | 9/2006 |
| JP | 2008-054323 A | 3/2008 |

*Primary Examiner* — Dalzid Singh
(74) *Attorney, Agent, or Firm* — White & Case LLP (57) ABSTRACT

A clock regeneration circuit includes: a signal input terminal; a D flip-flop circuit; a reset signal generation circuit; a delay circuit; a comparator; a first capacitor; and a feed back circuit. The signal input terminal is inputted with a pulse width modulation signal. The D flip-flop circuit includes a clock terminal, an output terminal, and a reset terminal. The reset signal generation circuit is configured to input a reset signal generated in synchronization with the pulse width modulation signal to the reset terminal at a first time. The delay circuit is configured to delay the pulse width modulation signal. The feedback circuit includes a current source having a control terminal. The feedback circuit is configured to change one of charge rise time and discharge fall time in response to the signal of the comparator to control duty cycle of the signal of the comparator.

18 Claims, 7 Drawing Sheets

(51) Int. Cl.
*H04L 7/033* (2006.01)
*H04L 25/49* (2006.01)

(56) References Cited

U.S. PATENT DOCUMENTS

| | | |
|---|---|---|
| 8,253,498 B2 | 8/2012 | Yagishita et al. |
| 8,917,804 B2 * | 12/2014 | Sano et al. ............ 375/364 |
| 2006/0279438 A1 | 12/2006 | Kishi et al. |
| 2007/0230648 A1 * | 10/2007 | Gupta et al. ........... 375/371 |
| 2011/0050302 A1 | 3/2011 | Yamaguchi |
| 2011/0215875 A1 | 9/2011 | Yagishita et al. |
| 2012/0033774 A1 * | 2/2012 | Tanaka et al. ......... 375/371 |
| 2013/0039648 A1 | 2/2013 | Uo |
| 2013/0214835 A1 | 8/2013 | Uo |

* cited by examiner

CLOCK REGENERATION CIRCUIT, LIGHT RECEIVING CIRCUIT, PHOTOCOUPLER, AND FREQUENCY SYNTHESIZER

CROSS-REFERENCE TO RELATED APPLICATIONS

This application is based upon and claims the benefit of priority from Japanese Patent Application No. 2012-263207, filed on Nov. 30, 2012; the entire contents of which are incorporated herein by reference.

FIELD

Embodiments described herein relate generally a clock regeneration circuit, a light receiving circuit, a photocoupler, and a frequency synthesizer.

BACKGROUND

In a photocoupler type insulating device for transmitting analog signals, an analog input signal is A/D converted, and digital data are transmitted in the insulated section. That is, by using one LED (light emitting diode), digital data and a clock signal are modulated and transmitted. In the receiving circuit, the clock signal is regenerated from the modulated signal, and the digital data are demodulated. Such a photocoupler type insulating device can transmit high-accuracy analog signals with e.g. the input/output circuit electrically insulated. Thus, in industrial equipment operated at high voltage, a high-accuracy control signal can be correctly transmitted and received.

Pulse width modulation (PWM) can be used as a modulation scheme for the photocoupler type insulating device. In this case, a delay-locked loop (DLL) circuit can be used to regenerate the clock signal. Polyphase clocks generated by the DLL circuit can be used to demodulate the digital data.

However, the PWM signal including multibit information in one period requires a very large number of polyphase clock signals to demodulate the digital data. Thus, in the receiving circuit in which a delay-locked loop circuit and a demodulation circuit are integrated, the circuit area and the power consumption are increased. This may make it difficult to reduce the size and power consumption of the circuit.

DETAILED DESCRIPTION

In general, according to one embodiment, a clock regeneration circuit includes: a signal input terminal; a D flip-flop circuit; a reset signal generation circuit; a delay circuit; a comparator; a first capacitor; and a feed back circuit. The signal input terminal is inputted with a pulse width modulation signal having a prescribed period and a fixed average duty cycle. The D flip-flop circuit includes a clock terminal, an input terminal supplied with a power supply voltage, an output terminal, and a reset terminal. The reset signal generation circuit is connected to the signal input terminal and configured to input a reset signal generated in synchronization with the pulse width modulation signal to the reset terminal. The delay circuit is connected to the signal input terminal and configured to delay the pulse width modulation signal by a first delay time and output toward the clock terminal. The comparator includes a first input terminal, a second input terminal supplied with a reference voltage, and an output terminal, and configured to output a signal having the prescribed period. The first capacitor is provided between the first input terminal and ground. The feedback circuit includes a current source having a control terminal. The current source is configured to change one of charge rise time and discharge fall time of the first capacitor by voltage of the control terminal changed in response to the signal of the comparator to control duty cycle of the signal of the comparator to a prescribed value.

Embodiments of the invention will now be described with reference to the drawings.

Figure 1:
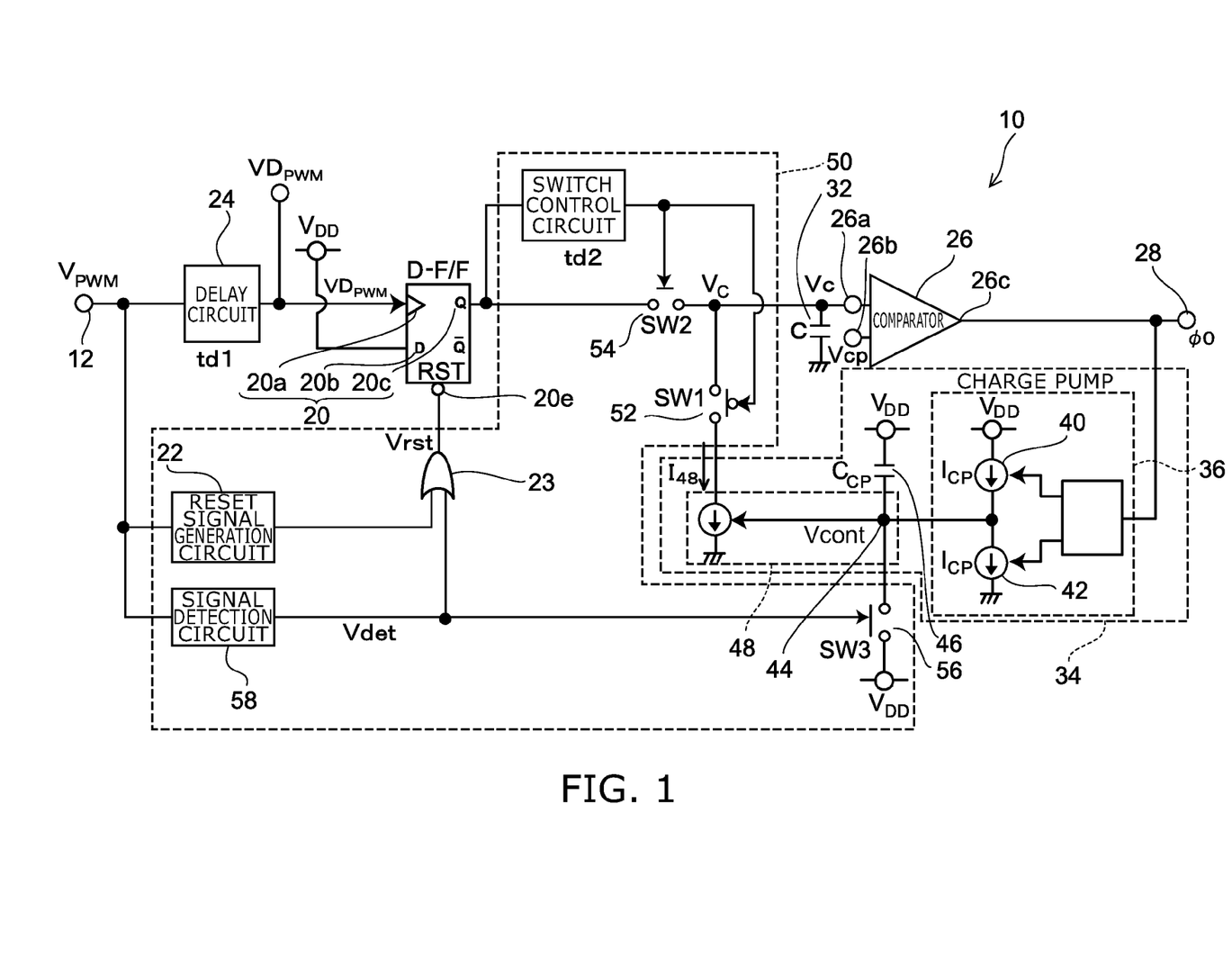
FIG. 1 is a block diagram showing the configuration of a clock regeneration circuit according to a first embodiment.

FIG. 1 is a block diagram showing the configuration of a clock regeneration circuit.

The clock regeneration circuit 10 includes a signal input terminal 12, a D flip-flop circuit (D-FF) 20, a delay circuit 24, a comparator 26, a first capacitor 32, a feedback circuit 34, and a controller 50. In the clock regeneration circuit 10, a pulse sequence of a PWM signal $V_{PWM}$ encoded with binary data and having a prescribed period Ts is inputted to the signal input terminal 12. The clock regeneration circuit 10 generates a clock signal $\phi 0$ having the prescribed period Ts and a prescribed duty cycle D. It is assumed that the pulse sequence of the PWM signal $V_{PWM}$ has a prescribed value of average duty cycle (e.g., 50%).

The D-FF 20 includes a clock terminal 20a, an input terminal (D) 20b, and an output terminal (Q) 20c. The input terminal 20b of the D flip-flop circuit 20 is supplied with a power supply voltage $V_{DD}$. The signal state of the input terminal 20b at the rise timing of the clock signal is outputted to the output terminal 20c. Until the next clock signal is inputted, the state of the output terminal 20c is held.

The delay circuit 24 delays the PWM signal $V_{PWM}$ inputted to the signal input terminal 12 by a first delay time td1 from its rise timing and outputs the delayed PWM signal $VD_{PWM}$ toward the clock terminal 20a. The delay circuit 24 can be e.g. a circuit in which an even number of inverter circuits are series connected, or a circuit composed of a logic circuit and a CR circuit.

The comparator 26 includes a first input terminal 26a, a second input terminal 26b supplied with a reference voltage Vcp, and an output terminal 26c. One terminal of the first capacitor 32 with capacitance C is connected to the first input terminal 26a of the comparator 26, and the other terminal is grounded.

The feedback circuit 34 can include e.g. a charge pump 36, a second capacitor 46 with capacitance Ccp, and a voltage controlled current source 48. The input side of the charge pump 36 is connected to the output terminal 26c of the comparator 26, and the output side is connected to a control terminal 44. The charge pump 36 includes a first current source 40 provided between the control terminal 44 and the power supply terminal, and a second current source 42 provided between the control terminal 44 and the ground.

One terminal of the second capacitor 46 is connected to the control terminal 44, and the other terminal is connected to the power supply voltage $V_{DD}$.

The voltage controlled current source 48 can control the temporal change of the voltage Vc of the first capacitor 32 by the control voltage Vcont of the control terminal 44. That is, by the current I48 depending on transconductance K (>0), the charge of the first capacitor 32 is discharged.

The controller 50 includes a first switch (SW1) 52 provided between the output terminal 20c of the D-FF 20 and the voltage controlled current source 48, and a second switch (SW2) 54 provided between the output terminal 20c of the D-FF 20 and the first input terminal 26a of the comparator 26.

As shown in FIG. 1, the controller 50 further includes one of a reset signal generation circuit 22, a signal detection circuit 58, a third switch (SW3) 56, and an OR circuit 23. The reset terminal 20e of the D-FF 20 is inputted at a first time with a reset signal Vrst synchronized with the rise timing of the PWM signal. If the reset signal Vrst is generated in synchronization with the rise of the PWM signal, the reset signal Vrst is outputted before the rise of the delayed PWM signal $VD_{PWM}$. Thus, the D-FF 20 can be returned to the state before the rise of the delayed PWM signal $VD_{PWM}$. Then, the voltage Vc of the first capacitor 32 and the clock signal φ0 being the output voltage signal of the comparator 26 are changed in conformity with the period of the delayed PWM signal $VD_{PWM}$.

In the case where the PWM signal $V_{PWM}$ is not inputted, the third switch 56 is shorted by the output signal Vdet of the signal detection circuit 58. Thus, the control voltage Vcont of the feedback circuit 34 can be set to a fixed value so that the circuit does not operate. On the other hand, in the case where the PWM signal $V_{PWM}$ is inputted, the third switch 56 is opened by the output signal Vdet of the signal detection circuit 58. Thus, the voltage controlled current source 48 is controlled by the control voltage Vcont of the control terminal 44. Accordingly, the feedback circuit 34 controls the clock regeneration circuit 10 toward the steady state while following the output pulse sequence of the delayed PWM signal $VD_{PWM}$.

Figure 2A:
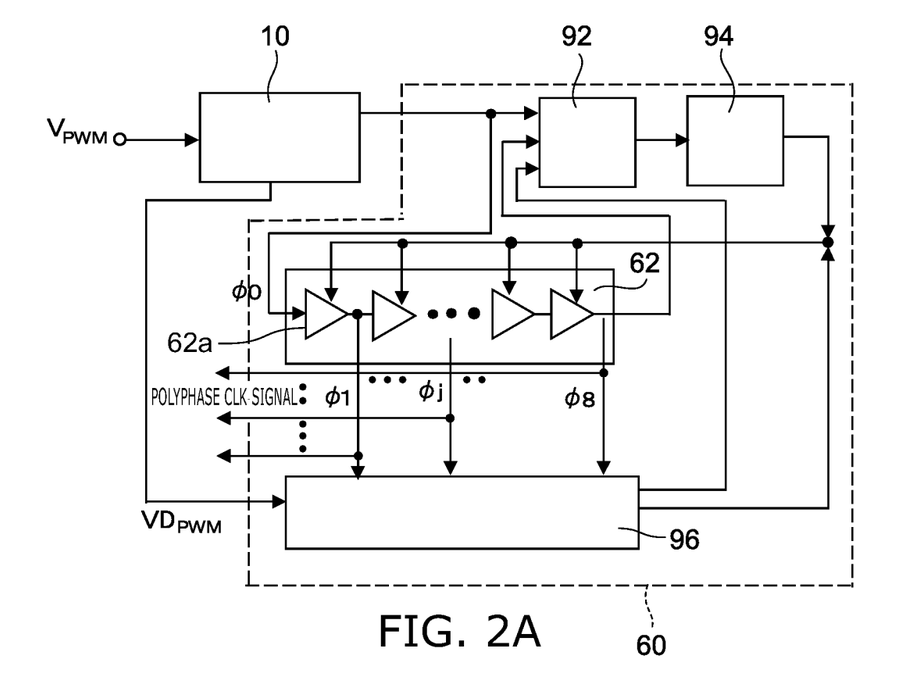
FIG. 2A is a block diagram of a delay-locked loop circuit provided with the clock regeneration circuit according to the first embodiment.
Figure 2B:
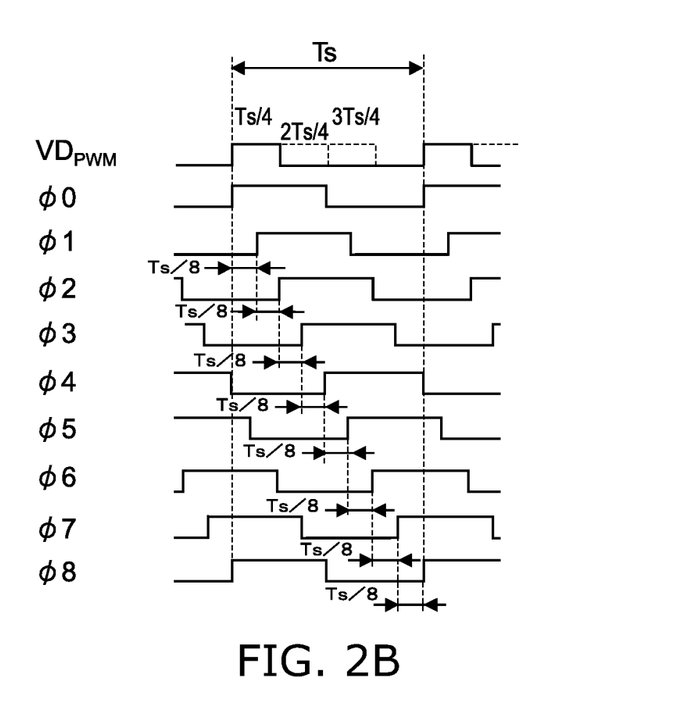
FIG. 2B is a waveform diagram of the input pulse width modulation signal, and the generated clock signal and polyphase clock signals having a prescribed duty cycle.

FIG. 2A is a block diagram of a delay-locked loop circuit connected to the clock regeneration circuit according to the first embodiment. FIG. 2B is a waveform diagram of the delayed PWM signal $VD_{PWM}$ and polyphase clock signals.

As shown in FIG. 2A, the delay-locked loop (DLL) circuit is a negative feedback circuit including e.g. a phase comparator 92, a charge pump 94, a voltage controlled delay line (VCDL) circuit 62, and a lock detection circuit 96.

The clock regeneration circuit 10 is inputted with a pulse width modulation (PWM) signal $V_{PWM}$. The clock regeneration circuit 10 outputs a clock (CLK) signal φ0 having a period equal to the period Ts of the PWM signal and having a prescribed duty cycle D. In the case where the transmitted digital data is of 1.5 bits, the pulse width of the inputted PWM signal $V_{PWM}$ can be set to e.g. three levels of Ts/4, 2Ts/4, and 3Ts/4. The DLL circuit 60 is inputted with the regenerated clock signal φ0. The lock detection circuit 96 is inputted with the delayed PWM signal $VD_{PWM}$. If the phase difference between the clock signals φ0 and φ8 becomes Ts/2 or more, the phase comparator 92 fails to operate normally. Furthermore, when there is no signal, the DLL should be stopped. For these reasons, the delayed PWM signal $VD_{PWM}$ is used.

The VCDL circuit 62 is configured so that voltage controlled delay elements 62a are series connected in multiple stages. The voltage controlled delay element 62a is composed of e.g. a transistor including a MOSFET (metal-oxide-semiconductor field-effect transistor) and a capacitance element. When the DLL circuit 60 is normally locked in the steady state, the respective voltage controlled delay elements 62a generate polyphase clock signals by delaying the rise timing of the clock signal φ0 little by little within the prescribed period Ts. For instance, as shown in FIG. 2B, polyphase clock signals φ1-φ8 with a time interval of Ts/8 can be generated and outputted.

The lock detection circuit 96 is inputted with the delayed PWM signal $VD_{PWM}$ and the clock signals φ0-φ8. If the phase difference between the clock signals φ0 and φ8 becomes Ts/2 or more, the phase comparator 92 fails to operate normally. Thus, the lock detection circuit 96 is used to detect the phase difference. The lock detection circuit 96 determines, in a wide range, the phase difference between the clock signals φ0 and φ8, i.e., the delay amount of the clock signal φ8 relative to the clock φ0. When the delay amount is smaller than a prescribed value, the lock detection circuit 96 outputs an UNDER signal. When the delay amount is larger than the prescribed value, the lock detection circuit 96 outputs an OVER signal. The UNDER signal and the OVER signal are outputted to the phase comparator circuit 92. Furthermore, when the delayed PWM signal $VD_{PWM}$ is not inputted, the lock detection circuit 96 determines that it is in the "initial state". Thus, the lock detection circuit 96 stops the operation of the charge pump 94 and outputs a control signal to each voltage controlled delay element 62a.

Figure 6A:
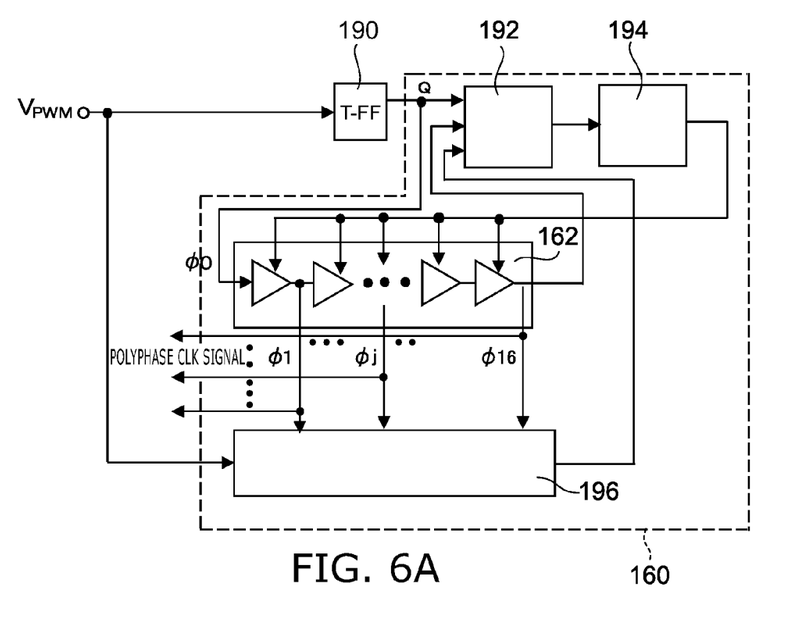
FIG. 6A is a block diagram of a DLL circuit according to a comparative example.
Figure 6B:
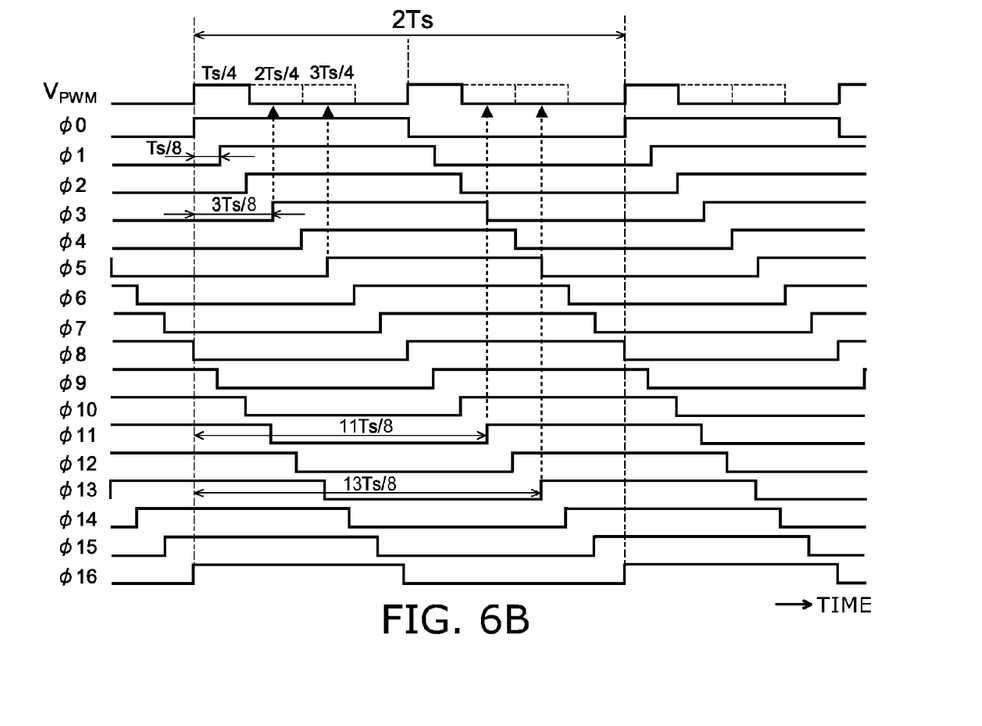
FIG. 6B is a timing chart thereof.

FIG. 6A is a block diagram of a DLL circuit according to a comparative example. FIG. 6B is a timing chart thereof.

The comparative example illustrates a DLL circuit in which the clock regeneration circuit is not used. As shown in FIG. 6A, the DLL circuit 160 includes a phase comparator 192, a charge pump 194, a VCDL circuit 162, and a lock detection circuit 196. The T-FF circuit 190 converts the input PWM signal $V_{PWM}$ to a voltage signal having a fixed duty cycle. This enables the lock detection circuit 196 to detect the phase difference.

However, the period of the polyphase clock is twice the period of the PWM signal $V_{PWM}$. As shown in FIG. 6B, demodulation of the PWM signal $V_{PWM}$ of Ts/4, 2Ts/4, and 3Ts/4 requires polyphase clocks of φ3 (between Ts/4 and 2Ts/4), φ5 (between 2Ts/4 and 3Ts/4), φ11 (between 5Ts/4 and 6Ts/4), and φ13 (between 6Ts/4 and 7Ts/4). As a result, the area of the VCDL circuit 162 is enlarged, and the power consumption is also increased.

In contrast, the clock regeneration circuit according to the first embodiment can generate a clock signal having the same period Ts as the PWM signal and having a fixed duty cycle. Thus, without using the T-FF circuit, the DLL circuit including a lock detection circuit can be driven. For instance, PWM signals of three levels can be demodulated by two clock signals of φ3 and φ5. That is, the area of the VCDL circuit is generally halved, and the power consumption can also be reduced to generally one half. Furthermore, downsizing of the light receiving circuit and the photocoupler is facilitated.

Figure 3:
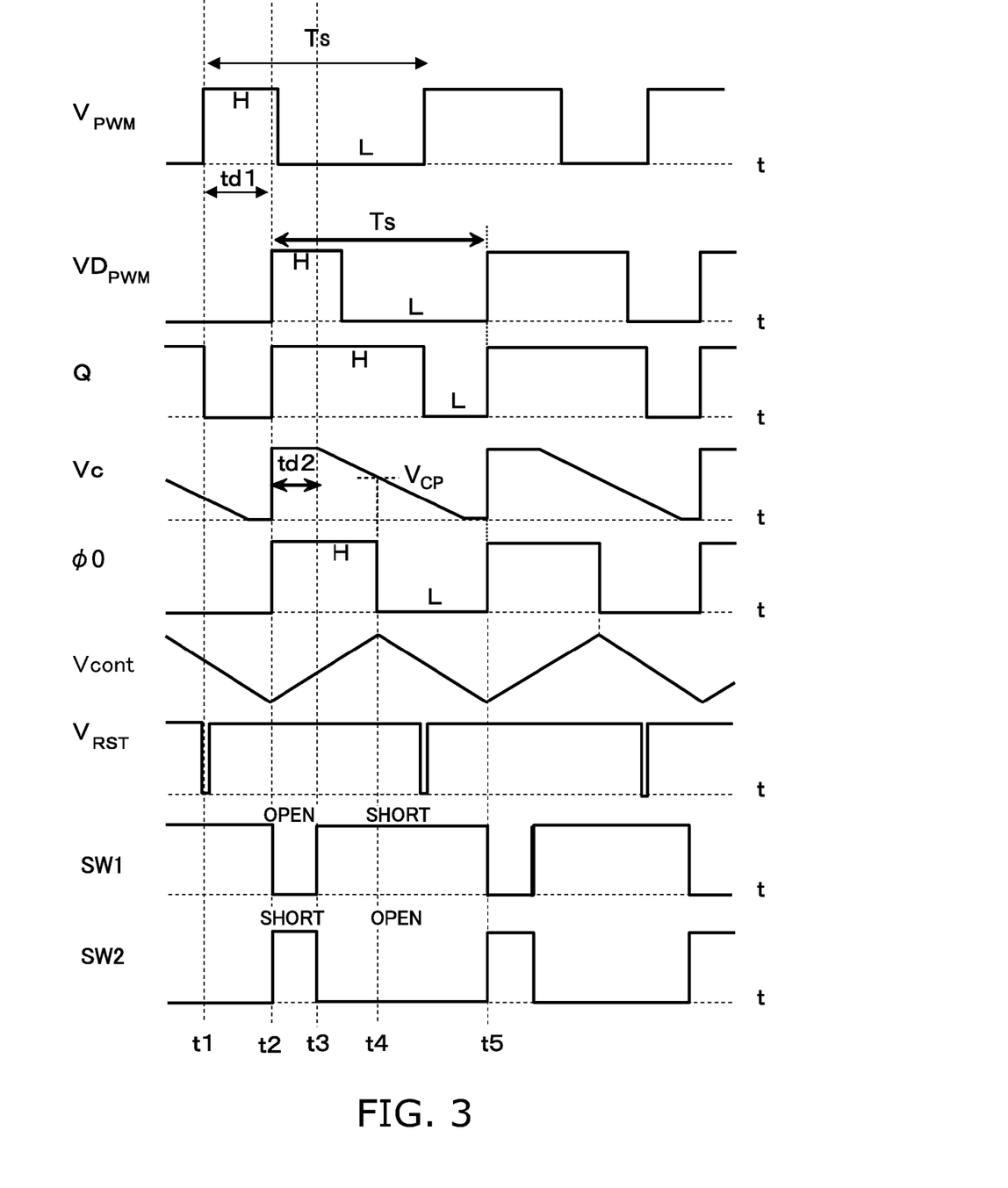
FIG. 3 is a timing chart illustrating the operation of the clock regeneration circuit according to the first embodiment.

FIG. 3 is a timing chart illustrating the operation of the clock regeneration circuit of the first embodiment.

At time t1, the reset signal Vrst synchronized with the rise of the PWM signal $V_{PWM}$ is issued from the reset signal generation circuit 22 and inputted to the reset terminal 20e of the D-FF 20. Thus, the positive phase output Q of the D-FF 20 is set to low (L) level, and the negative phase output (denoted by Q−) is set to high (H) level. Then, after a fixed time, the reset state is canceled. At this time, the first switch 52 is short, and the second switch 54 is open. Thus, the voltage Vc of the first capacitor is not affected. At time t2, the PWM signal $VD_{PWM}$ of period Ts delayed by the first delay time td1 is inputted to the clock terminal 20a of the D-FF 20. The input terminal 20b of the D-FF 20 is connected to power supply. Thus, in synchronization with the rise of the delayed PWM signal $V_{PWM}$, the positive phase output Q turns to high (H) level. Here, the first delay time td1 is set so that Vrst has been canceled at the rise time of $VD_{PWM}$.

In synchronization with the rise of the positive phase output Q of the D-FF 20, the first switch 52 is opened, and the second switch 54 is shorted. This state continues for the duration of the second delay time td2. During this time, the voltage Vc of the first capacitor 32 is equipotential to the positive phase output Q of the D-FF 20. At time t3 after the second delay time td2 from time t2, the potential of the positive phase output Q of the D-FF 20 is at the power supply voltage $V_{DD}$ (H level). Thus, the voltage Vc of the first capacitor 32 at this time is also set to $V_{DD}$. Accordingly, the clock signal φ0 being the output voltage signal of the comparator 26 is set to H level.

Subsequently, at time t3, the first switch 52 is shorted, and the second switch 54 is opened. Then, the first capacitor 32 is disconnected from the positive phase output terminal of the D-FF 20, and extraction of charge from the first capacitor 32 is started by the voltage controlled current source 48. Thus, the voltage Vc of the first capacitor starts to decrease. That is, the fall time of the potential Vc of the first capacitor 32 can be controlled by the control voltage Vcont of the voltage controlled current source 48. Here, if the transconductance of the voltage controlled current source 48 is K (>0), the current I48 can be expressed as K·Vcont. The second input terminal 26b of the comparator 26 is supplied with Vcp as a reference voltage. When the potential Vc of the first capacitor 32 is lowered to the reference voltage Vcp at time t4, the clock signal φ0 being the output voltage signal of the comparator 26 turns to L level.

Even if the clock signal φ0 turns to L level, the state of the first switch 52 and the second switch 54 remains unchanged. Thus, the voltage Vc of the first capacitor 32 continues to change toward the ground potential (L level). This state continues until the occurrence of the reset signal Vrst issued in synchronization with the next rise of the delayed PWM signal $V_{PWM}$. At time t5, the state turns to H level like the state at time t2. Thus, the positive pulse duty cycle D of the clock signal φ0 in this case is (t4−t2)/Ts.

In the case where the positive pulse duty cycle of the clock signal φ0 being the output voltage signal of the comparator 26 is larger than a prescribed value (e.g., 50%), the feedback circuit 34 acts to raise the control voltage Vcont. If the control voltage Vcont is raised, the fall time of the voltage Vc of the first capacitor 32 is made shorter. Thus, the positive pulse duty cycle of the clock signal φ0 is decreased and matched with the prescribed value. On the other hand, in the case where the positive pulse duty cycle of the clock signal φ0 is smaller than the prescribed value (e.g., 50%), the feedback circuit 34 acts to lower the control voltage Vcont. If the control voltage Vcont is lowered, the fall time of the voltage Vc of the first capacitor 32 is made longer. Thus, the positive pulse duty cycle D of the clock signal φ0 is increased and matched with the prescribed value.

For instance, it is assumed that the feedback circuit 34 includes a charge pump 36 and a second capacitor 46, and that the charge pump 36 is connected to the output terminal 26c of the comparator 26. Consider the case where the positive pulse duty cycle D of the clock signal φ0 being the output voltage signal of the comparator 26 inputted to the charge pump 36 is smaller than the prescribed cycle (e.g., 50%). When φ0 is at H level, the first current source 40 is turned on, and the second current source 42 is turned off. On the other hand, when φ0 is at L level, the second current source 42 is turned on, and the first current source 40 is turned off. Consider the change of Vcont during one period of the clock signal φ0. The negative pulse width of the clock signal φ0 is larger than its positive pulse width. Thus, the average output current of the charge pump 36 serves as a sink current, and increases the accumulated charge of the second capacitor 46. This results in lowering the control voltage Vcont and decreasing the current I48 of the voltage controlled current source 48. Thus, the fall time of the voltage Vc of the first capacitor 32 is made longer. Accordingly, the positive pulse duty cycle D of the clock signal φ0 can be increased and made close to the prescribed cycle (e.g., 50%).

On the other hand, consider the case where the positive pulse duty cycle D of the clock signal φ0 being the output voltage signal of the comparator 26 inputted to the charge pump 36 is larger than the prescribed cycle (e.g., 50%). Consider the change of Vcont during one period of the clock signal φ0. The positive pulse width of the clock signal φ0 is larger than its negative pulse width. Thus, the average output current of the charge pump 36 serves as a source current, and decreases the accumulated charge of the second capacitor 46. This results in raising the control voltage Vcont and increasing the current I48 of the voltage controlled current source 48. Thus, the fall time of the voltage Vc of the first capacitor 32 is made shorter. Accordingly, the positive pulse duty cycle D of the clock signal φ0 can be decreased and made close to the prescribed cycle (e.g., 50%).

Thus, depending on the duty cycle D of the clock signal φ0, the feedback circuit 34 controls the charge pump 36, and controls the control voltage Vcont of the voltage controlled current source 48 to constitute a negative feedback circuit. Accordingly, in the case where the pulse sequence of the delayed PWM signal $VD_{PWM}$ is inputted to the clock regeneration circuit 10, the duty cycle D of the clock signal φ0 converges to the prescribed cycle (e.g., 50%) and leads to the steady state. As a result, a clock signal having period Ts with the duty cycle D being the prescribed cycle (e.g., 50%) can be generated.

Most of the current consumed in the first embodiment occurs in charging and discharging the first capacitor 32. In one period Ts, the first capacitor 32 charges and discharges a charge of $C \times V_{DD}$. Thus, the consumption current $I_{DD}$ can be approximated by equation (1).

$$I_{DD} = C \times V_{DD}/Ts \qquad (1)$$

The values of the power supply voltage $V_{DD}$ and the period Ts are determined by the purpose of the system. Thus, the consumption current $I_{DD}$ can be reduced by reducing the capacitance C. The lower limit value of the capacitance C is not limited by the negative feedback operation. Thus, the capacitance C can be reduced to the value determined by the limit of the semiconductor process (e.g., tradeoff of formation accuracy, leakage current and the like).

In the case where the clock signal φ0 is continuously outputted and can be regarded as being in the steady state after a sufficient passage of time, the positive pulse duty cycle D of the clock signal φ0 is determined by the sink current source (current source 42) and the source current source (current source 40) of the charge pump 36. In the first embodiment, the absolute values of the sink current and the source current of the charge pump 36 are set equal. Thus, the positive pulse duty cycle D is 50%. The sink current is denoted by $I_{cp\ snk}$, and the source current is denoted by $I_{cp\ sre}$. Then, the positive pulse duty cycle D after a sufficient passage of time is expressed by equation (2).

$$D(t\to\infty)=1/(1+I_{cp\ sre}/I_{cp\ snk}) \quad (2)$$

That is, by setting the ratio of $I_{cp\ sre}$ to $I_{cp\ snk}$, the positive pulse duty cycle D of the outputted clock signal φ0 is determined. The setting accuracy of the duty cycle D depends on the accuracy of current mirror ratio of the sink current source (current source 42) and the source current source (current source 40) of the charge pump.

The signal detection circuit 58 can be constituted by a low-pass filter, inverter elements having an input threshold of $0.25V_{DD}$ and $0.75V_{DD}$, and normal logic elements. In the case where the time constant of the low-pass filter is much larger than the period of the $V_{PWM}$ signal, the signal is detected by utilizing the fact that the low-pass filter outputs a signal corresponding to the average duty cycle D of the input signal. For instance, if the average duty cycle D of the $V_{PWM}$ signal is 50%, the low-pass filter output in response to input of the $V_{PWM}$ signal is $0.5V_{DD}$. On the other hand, the low-pass filter output with no input of the $V_{PWM}$ signal is $V_{DD}$ or the ground potential. Thus, the presence or absence of the input signal can be easily detected by detecting the low-pass filter output by the inverter elements having an input threshold of $0.25V_{DD}$ and $0.75V_{DD}$.

The voltage controlled current source 48 can be made of e.g. an NMOSFET.

In the case where the PWM signal $V_{PWM}$ is not inputted, the signal detection circuit 58 is operated to set the circuit to the initial state. When the PWM signal $V_{PWM}$ is inputted, the control voltage Vcont is controlled by the feedback circuit 34, and the duty cycle D of the clock signal φ0 being the output voltage converges to a prescribed value. Here, in the initial state of the first embodiment, preferably, the output current $I_{48}$ of the voltage controlled current source 48 is maximized, i.e., the control voltage Vcont is set to the maximum ($V_{DD}$). That is, the control voltage Vcont is generally lowered with the passage of time.

The reset signal Vrst can be generated in synchronization with the rise of the PWM signal $V_{PWM}$. The clock signal φ0 being the output voltage signal of the comparator 26 is switched from H level to L level in the time during which the potential Vc of the first capacitor 32 is lowered to generally $0.5V_{DD}$.

If the capacitance Ccp of the second capacitor 46 is made larger and the current Icp of the charge pump circuit is made smaller, then the variation ΔVcont of the control voltage Vcont in one period Ts of the PWM signal $VD_{PWM}$ can be approximated by equation (3) as the sum of the increase during time t2-t4 at H level and the decrease during time t4-t5 at L level.

$$\Delta Vcont=D\times Ts\times Icp/Ccp-(1-D)\times Ts\times Icp/Ccp=(2D-1)\times Icp/Ccp \quad (3)$$

Here, it is assumed that the absolute values of the sink current and the source current are equal and set to Icp. When the time t becomes sufficiently large, the variation ΔVcont of the control voltage Vcont comes close to zero by the function of the feedback circuit 34, and the control voltage Vcont converges to a fixed value. Thus, it is found from equation (3) that, irrespective of the current value Icp and the capacitance Ccp of the second capacitor 46, the duty cycle D of the output voltage signal comes close to 0.5.

Figure 4A:
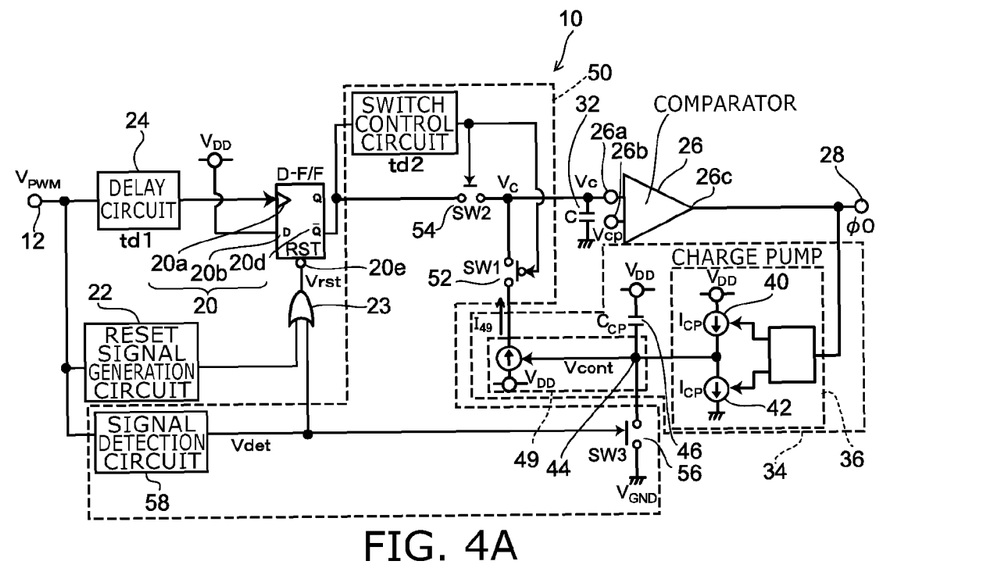
FIG. 4A is a block diagram of a clock regeneration circuit according to a second embodiment.
Figure 4B:
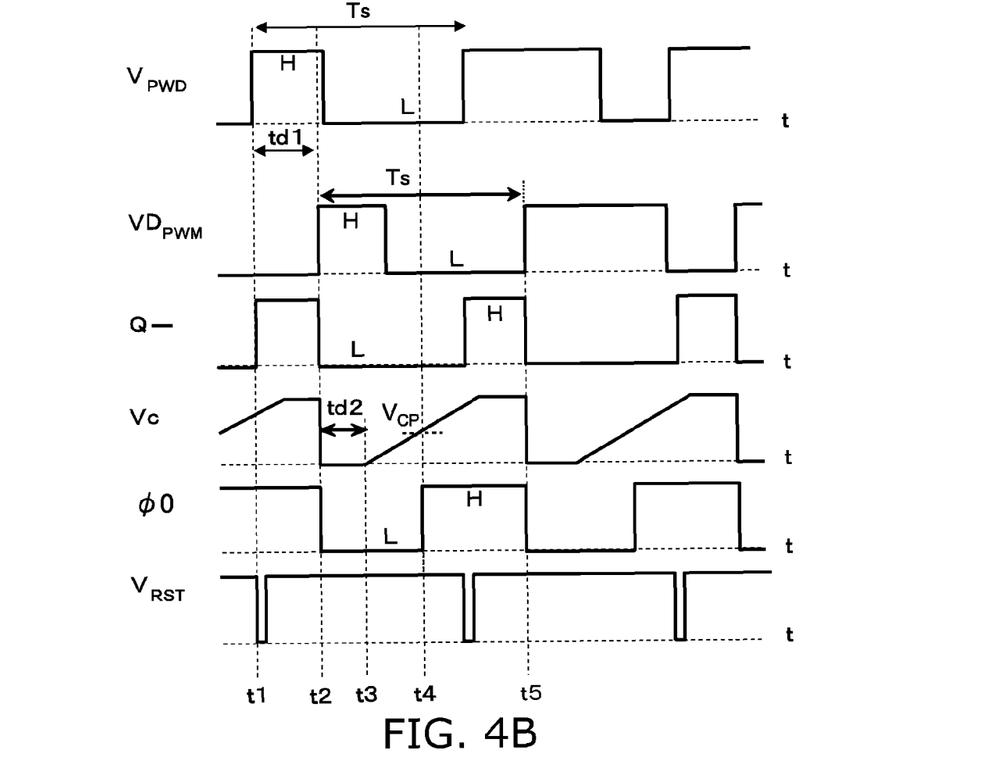
FIG. 4B is a timing chart thereof.

FIG. 4A is a block diagram of a clock regeneration circuit of a second embodiment. FIG. 4B is a timing chart thereof.

As shown in FIG. 4A, in the second embodiment, the first input terminal 26a of the comparator 26 is inputted with the negative phase output from the output terminal 20d (denoted by Q−) of the D-FF 20. Simultaneously, the voltage controlled current source 49 is connected in the direction of charging the first capacitor 32.

That is, as shown in FIG. 4B, at time n, the reset signal Vrst synchronized with the rise of the PWM signal $V_{PWM}$ is issued from the reset signal generation circuit 22 and inputted to the reset terminal 20e of the D-FF 20. Thus, the positive phase output of the D-FF 20 is set to L level, and the negative phase output is set to H level. Then, after a fixed time, the reset state is canceled. At this time, the first switch 52 is short, and the second switch 54 is open. Thus, the voltage Vc of the first capacitor 32 is not affected. At time t2, the PWM signal $VD_{PWM}$ delayed by the first delay time td1 is inputted to the clock terminal 20a of the D-FF 20. The input terminal 20b of the D-FF 20 is connected to power supply. Thus, in synchronization with the rise of the delayed PWM signal $VD_{PWM}$, the negative phase output turns to L level. Here, the first delay time td1 is set so that Vrst has been canceled at the rise time of $VD_{PWM}$. In synchronization with the fall of the negative phase output of the D-FF 20, the first switch 52 is opened, and the second switch 54 is shorted. This state continues for the duration of the second delay time td2. During this time, the voltage Vc of the first capacitor 32 is equipotential to the negative phase output of the D-FF 20. At time t3 after the second delay time td2 from time t2, the potential of the negative phase output of the D-FF 20 is at the ground potential (L level). Thus, the voltage Vc of the first capacitor 32 at this time is also set to the ground potential. Accordingly, the clock signal φ0 being the output voltage signal of the comparator 26 is set to L level.

Subsequently, at time t3, the first switch 52 is shorted, and the second switch 54 is opened. Then, the first capacitor 32 is disconnected from the negative phase output terminal of the D-FF 20, and charging to the first capacitor 32 is started by the voltage controlled current source 49. Thus, the voltage Vc of the first capacitor 32 starts to increase. That is, the rise time of the potential Vc of the first capacitor 32 can be controlled by the control voltage Vcont of the voltage controlled current source 49. Here, if the transconductance of the voltage controlled current source 49 is K (>0), the current $I_{49}$ can be expressed as K·($V_{DD}$−Vcont). The second input terminal 26b of the comparator 26 is supplied with Vcp as a reference voltage. When the potential Vc of the first capacitor 32 is raised to the reference voltage Vcp at time t4, the clock signal φ0 being the output voltage signal of the comparator 26 turns to H level.

Even if the clock signal φ0 turns to H level, the state of the first switch 52 and the second switch 54 remains unchanged. Thus, the voltage Vc of the first capacitor continues to change toward the power supply potential (H level). This state continues until the occurrence of the reset signal Vrst issued in synchronization with the next rise of the delayed PWM signal $VD_{PWM}$. At time t5, the state turns to L level like the state at time t2. Thus, the positive pulse duty cycle D of the clock signal φ0 in this case is (t5−t4)/Ts.

In the case where the positive pulse duty cycle D of the clock signal φ0 being the output voltage signal of the comparator 26 is larger than a prescribed value (e.g., 50%), the feedback circuit 34 acts to raise the control voltage Vcont. If the control voltage Vcont is raised, the rise time of the voltage Vc of the first capacitor 32 is made longer. Thus, the positive pulse duty cycle D of the clock signal φ0 is increased and matched with the prescribed value. On the other hand, in the case where the positive pulse duty cycle D of the clock signal φ0 is smaller than the prescribed value (e.g., 50%), the feedback circuit 34 acts to lower the control voltage Vcont. If the control voltage Vcont is lowered, the rise time of the voltage Vc of the first capacitor 32 is made shorter. Thus, the positive pulse duty cycle D of the clock signal φ0 is increased and matched with the prescribed value.

Here, in the initial state of the second embodiment, preferably, the output current $I_{49}$ of the voltage controlled current source 49 is maximized, i.e., the control voltage Vcont is set to the minimum (ground potential). That is, the control voltage Vcont is generally raised with the passage of time. After a sufficient passage of time, the control voltage Vcont converges toward a fixed value. That is, the positive pulse duty cycle D of the clock signal φ0 converges toward the prescribed value (e.g., 50%).

The D-FF 20 may have a set terminal instead of the reset terminal. Moreover, the clock regeneration circuit may have a set signal generation circuit instead of the reset signal generation circuit 22.

Figure 5A:
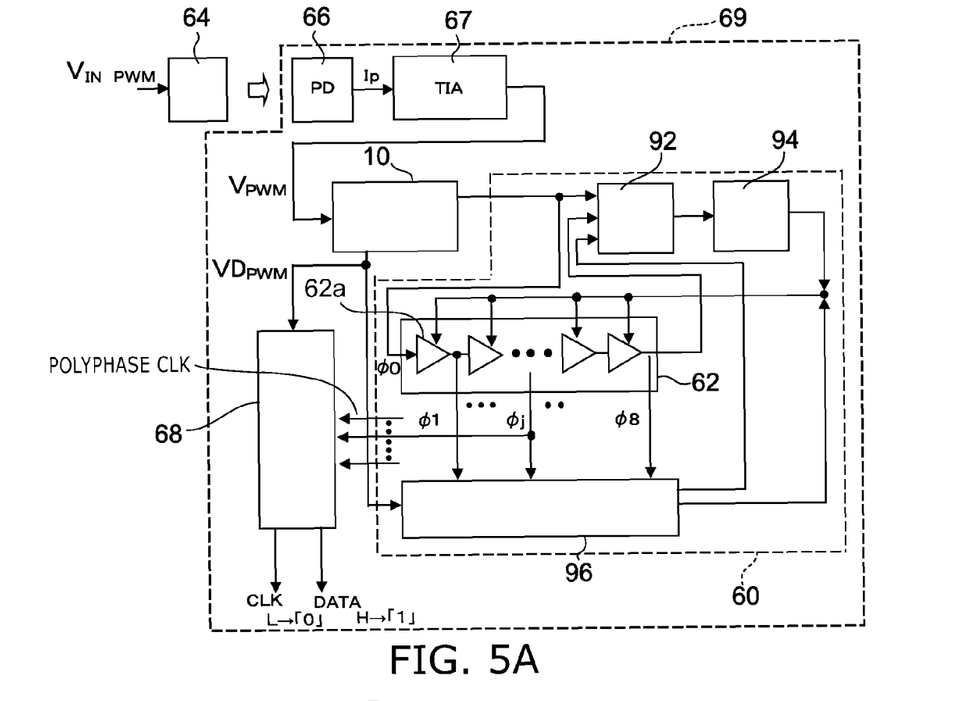
FIG. 5A is a block diagram of a light receiving circuit including the DLL circuit according to the first to third embodiments.
Figure 5B:
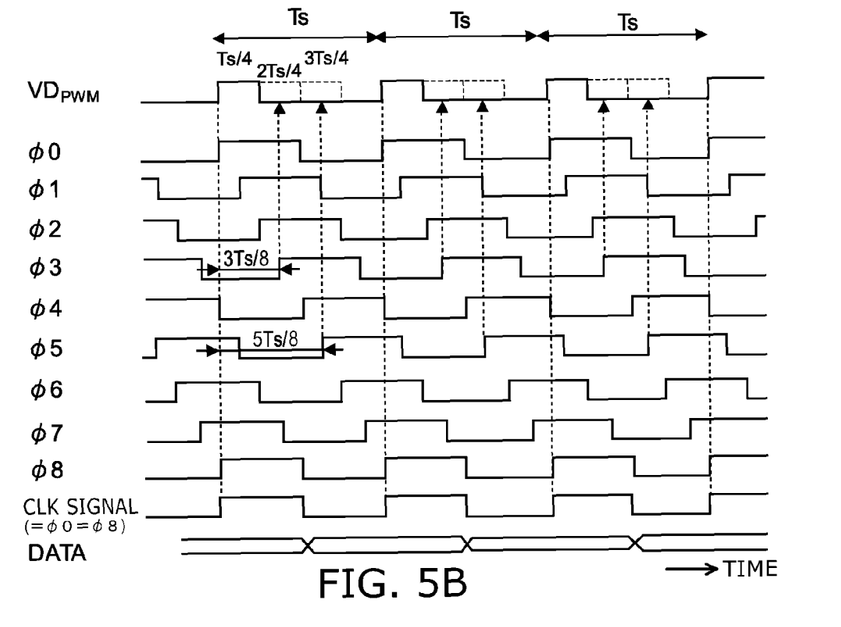
FIG. 5B illustrates demodulated binary data corresponding to the pulse width modulation signal.

FIG. 5A is a block diagram of a photocoupler including a light receiving circuit including the clock regeneration circuit according to the first and second embodiments. FIG. 5B is an operation timing chart of the light receiving circuit.

As shown in FIG. 5A, the light receiving circuit 69 includes e.g. a light receiving element (PD) 66, a transimpedance amplifier (TIA) 67, a clock regeneration circuit 10, a delay-locked loop (DLL) circuit 60, and a demodulation circuit 68. Furthermore, a light emitting element 64 modulatable by an input signal $V_{IN\_PWM}$ can be optically coupled to the light receiving circuit 69 to constitute a photocoupler.

The light emitting element 64 emits an optical signal modulated by the input PWM signal $V_{IN\_PWM}$. The emitted optical signal is converted to a current signal Ip by the light receiving element 66, and amplified by the transimpedance amplifier (TIA) 67 and the like. Thus, the current signal Ip is converted to a PWM (voltage) signal $V_{PWM}$. The PWM signal $V_{PWM}$ is inputted to the clock regeneration circuit 10, which outputs a delayed PWM signal $VD_{PWM}$ and a clock signal φ0. Polyphase clocks synchronized with the clock signal φ0 are generated in the DLL circuit 60 and inputted to the demodulation circuit 68. The demodulation circuit 68 determines the delayed PWM signal $VD_{PWM}$ at the polyphase clock timing to demodulate the digital data modulated on $VD_{PWM}$. Such a configuration can realize a photocoupler in which input/output is electrically insulated and a high-accuracy analog electrical signal can be transmitted.

Here, the PWM signal can also be transmitted/received by an electric field coupled system or a magnetically coupled system without the intermediary of an optically coupled system.

By changing the pulse width of the PWM signal, "0" and "1" signals as binary data can be assigned thereto.

As shown in FIG. 5B, it is assumed that the average duty cycle D of the PWM signal $V_{PWM}$ is 50%, and signals having a pulse width of Ts/4, 2Ts/4, and 3Ts/4 are demodulated. For instance, the binary data "1" is modulated to 2Ts/4, and the binary data "0" is modulated to Ts/4 and 3Ts/4 with a probability of 50%. Then, irrespective of the binary data, the duty cycle of the $V_{PWM}$ signal is 50%. That is, a 0.5-bit worth is used to fix the average duty cycle.

In the case where the pulse width of the PWM signal $V_{PWM}$ has three levels, eight kinds of polyphase clocks are preferably used for demodulation. That is, the DLL circuit 60 performs control so that the delay difference period between φ0 and φ8 is Ts. Thus, when the PWM signal $VD_{PWM}$ delayed by the clock signals φ3 (corresponding to a time of 3Ts/8) and φ5 (corresponding to a time of 5Ts/8) is detected, the hold time is maximized, and the digital data can be stably demodulated.

In general, in the case where one period of the PWM signal $V_{PWM}$ contains K bits (K being an integer) of information, the pulse width of $V_{PWM}$ has 2K levels. In this case, the hold time in the demodulation circuit can be maximized by preparing 2×(2K+1) kinds of polyphase clocks.

Figure 7:
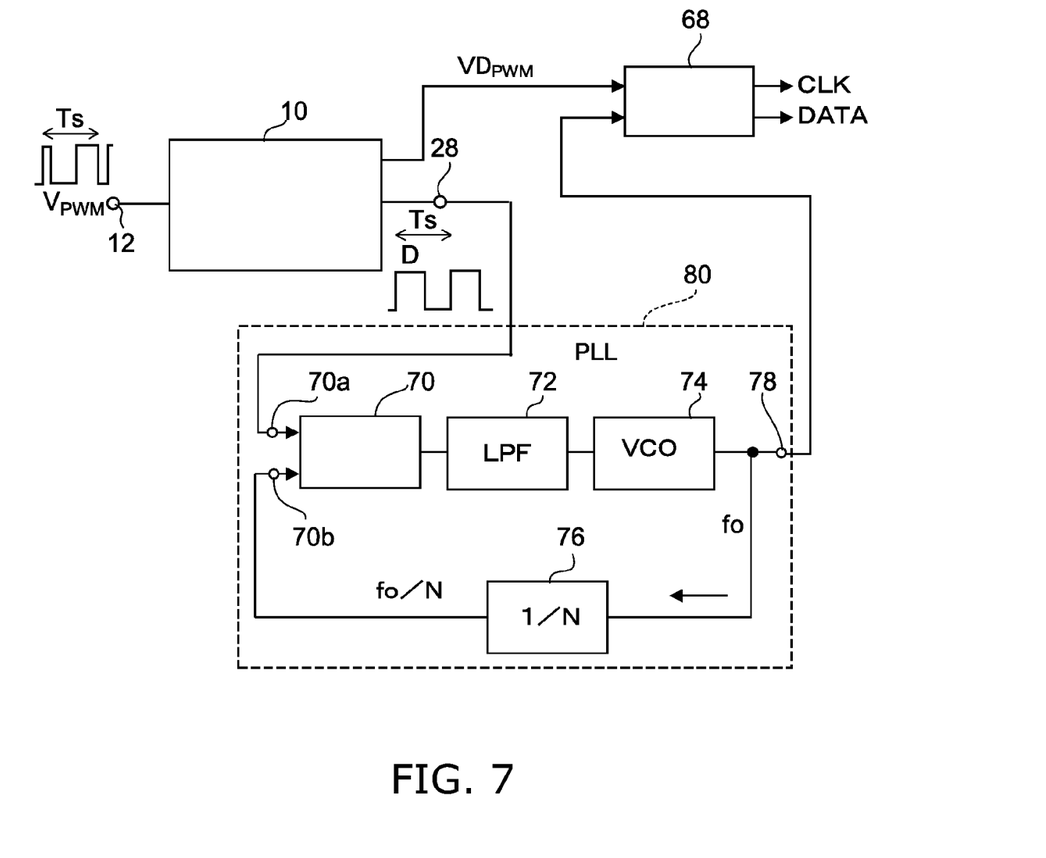
FIG. 7 is a block diagram of a frequency synthesizer based on the first to third clock regeneration circuits.

FIG. 7 is a block diagram of a frequency synthesizer based on the first and second clock regeneration circuits.

The frequency synthesizer includes the clock regeneration circuit 10 of the first to third embodiments, and a phase locked loop (PLL) circuit 80.

The PLL circuit 80 includes a phase comparator 70 having a first input terminal 70a and a second input terminal 70b, a loop filter 72 for smoothing the output from the phase comparator 70, a voltage controlled oscillator (VCO) 74, and a frequency divider 76 for lowering the frequency of the output signal of the VCO 74 to 1/N (N being an integer) for input to the second terminal 70b of the phase comparator 70.

The PLL circuit 80 produces a signal corresponding to the phase difference between the clock signal inputted to the first input terminal 70a and the output signal of the frequency divider 76 inputted to the second input terminal 70b. The PLL circuit 80 inputs the signal corresponding to the phase difference to the loop filter 72. The loop filter 72 smoothes the signal for output to the VCO 74. The VCO 74 can control the oscillation frequency by the input voltage signal. The frequency divider 76 lowers the output frequency of the VCO 74 to 1/N for input as a feedback to the second terminal 70b of the phase comparator 70. Thus, the frequency divider 76 performs control so that the signals at the first input terminal 70a and the second input terminal 70b are matched.

In the case where the PLL circuit 80 normally converges, the VCO 74 outputs, from the output terminal 78, an output voltage signal having a frequency equal to N times the frequency of the clock signal and synchronized with the clock signal. In the case of demodulation, by using a counter circuit and the like, the phase difference between the PLL output signal and the PWM signal $V_{PWM}$ can be calculated to determine the pulse width of the PWM signal $V_{PWM}$. In the case where the digital signal contained in the PWM signal $V_{PWM}$ is of 1.5 bits, the hold time is maximized in the demodulation circuit 68 by setting N=8. On the other hand, in the case where the PWM signal $V_{PWM}$ contains K bits (K being an integer) of information, the hold time is maximized in the demodulation circuit 68 by setting N=2×(2K+1).

Because the PLL circuit 80 includes a loop filter 72, the PLL circuit 80 can suppress jitter in the input signal. Furthermore, the duty cycle D of the signal inputted to the PLL circuit 80 can be kept at a prescribed cycle. Thus, the frequency synthesizer of the present embodiments can enhance the frequency pulling performance of the VCO 74 and stably operate the PLL circuit 80.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A clock regeneration circuit comprising:
a signal input terminal inputted with a pulse width modulation signal having a prescribed period and a fixed average duty cycle;
a D flip-flop circuit including a clock terminal, an input terminal supplied with a power supply voltage, an output terminal and a reset terminal;
a reset signal generation circuit connected to the signal input terminal and configured to input a reset signal generated in synchronization with the pulse width modulation signal to the reset terminal;
a delay circuit connected to the signal input terminal and configured to delay the pulse width modulation signal by a first delay time and output toward the clock terminal;
a comparator including a first input terminal, a second input terminal supplied with a reference voltage, and an output terminal, and configured to output a signal having the prescribed period;
a first capacitor connected between the first input terminal and ground; and
a feedback circuit including a current source having a control terminal, the current source being configured to change one of charge rise time and discharge fall time of the first capacitor by voltage of the control terminal changed in response to the signal of the comparator to control duty cycle of the signal of the comparator to a prescribed value.

2. The circuit according to claim 1, wherein
the feedback circuit further includes a charge pump provided between the output terminal of the comparator and the control terminal, and
the charge pump changes the voltage of the control terminal in response to the signal of the comparator inputted thereto.

3. The circuit according to claim 2, wherein
if the duty cycle of the signal of the comparator is larger than the prescribed value, the charge pump decreases the duty cycle by increasing a source current, and
if the duty cycle of the signal of the comparator is smaller than the prescribed value, the charge pump increases the duty cycle by increasing a sink current.

4. The circuit according to claim 3, wherein
output of the D flip-flop circuit has a positive phase, and
the current source discharges the first capacitor.

5. The circuit according to claim 3, wherein
output of the D flip-flop circuit has a negative phase, and
the current source charges the first capacitor.

6. The circuit according to claim 2, wherein
output of the D flip-flop circuit has a positive phase, and
the current source discharges the first capacitor.

7. The circuit according to claim 2, wherein
output of the D flip-flop circuit has a negative phase, and
the current source charges the first capacitor.

8. The circuit according to claim 1, wherein
output of the D flip-flop circuit has a positive phase, and
the current source discharges the first capacitor.

9. The circuit according to claim 8, further comprising:
a controller configured to switch the first input terminal of the comparator to one of the output terminal of the D flip-flop circuit and the current source,
wherein when the output of the D flip-flop circuit is switched, the controller connects the output terminal of the D flip-flop circuit to the first input terminal,
after the output of the D flip-flop circuit is switched, and then after delay of a second delay time, the controller charges or discharges the first capacitor, and
when a potential of the first capacitor changes and crosses the reference voltage, the signal of the comparator is switched.

10. The circuit according to claim 1, wherein
output of the D flip-flop circuit has a negative phase, and
the current source charges the first capacitor.

11. The circuit according to claim 10, further comprising:
a controller configured to switch the first input terminal of the comparator to one of the output terminal of the D flip-flop circuit and the current source,
wherein when the output of the D flip-flop circuit is switched, the controller connects the output terminal of the D flip-flop circuit to the first input terminal,
after the output of the flip-flop circuit is switched, and then after delay of a second delay time, the controller charges or discharges the first capacitor, and
when a potential of the first capacitor changes and crosses the reference voltage, the signal of the comparator is switched.

12. A light receiving circuit comprising:
the clock regeneration circuit according to claim 1;
a light receiving element configured to receive an optical signal;
a delay-locked loop circuit inputted with the signal of the comparator and including a voltage controlled delay line circuit; and
a demodulation circuit capable of outputting a data sequence generated by determining and demodulating the delayed pulse width modulation signal outputted from the light receiving element at rise timing of a polyphase clock signal, and a clock signal.

13. A photocoupler comprising:
the light receiving circuit according to claim 12; and
a light emitting element electrically insulated from the light receiving element and configured to emit the optical signal modulated by a transmitting side pulse width modulation signal.

14. A frequency synthesizer comprising:
the clock regeneration circuit according to claim 1; and
a phase locked loop circuit including a phase comparator having a first input terminal and a second input terminal, a loop filter configured to smooth an output voltage from the phase comparator, a voltage controlled oscillator, and a frequency divider configured to lower frequency of an output signal of the voltage controlled oscillator by a factor of an integer for input to the second input terminal of the phase comparator, the phase locked loop circuit being configured to input an output to the loop filter, the output corresponding to phase difference between a clock signal outputted from the clock regeneration circuit and inputted to the first input terminal and an output signal of the frequency divider inputted to the second input terminal,
the frequency synthesizer being configured to output a clock signal synchronized with the clock signal and having a prescribed frequency.

15. A clock regeneration circuit comprising:
a signal input terminal inputted with a pulse width modulation signal having a prescribed period and a fixed average duty cycle;
a D flip-flop circuit including a clock terminal, an input terminal supplied with a power supply voltage, and an output terminal and a set terminal;
a set signal generation circuit connected to the signal input terminal and configured to input a set signal generated in synchronization with the pulse width modulation signal to the set terminal;

a delay circuit connected to the signal input terminal and configured to delay the pulse width modulation signal by a first delay time and output toward the clock terminal;

a comparator including a first input terminal, a second input terminal supplied with a reference voltage, and an output terminal, and configured to output a signal having the prescribed period;

a first capacitor connected between the first input terminal and ground; and a feedback circuit including a current source having a control terminal, the current source being configured to change one of charge rise time and discharge fall time of the first capacitor by voltage of the control terminal changed in response to the signal of the comparator to control duty cycle of the signal of the comparator to a prescribed value.

16. A light receiving circuit comprising:

the clock regeneration circuit according to claim 15;

a light receiving element configured to receive an optical signal;

a delay-locked loop circuit inputted with the signal of the comparator and including a voltage controlled delay line circuit; and a demodulation circuit capable of outputting a data sequence generated by determining and demodulating the delayed pulse width modulation signal outputted from the light receiving element at rise timing of a polyphase clock signal, and a clock signal.

17. A photocoupler comprising:

the light receiving circuit according to claim 16; and a light emitting element electrically insulated from the light receiving element and configured to emit the optical signal modulated by a transmitting side pulse width modulation signal.

18. A frequency synthesizer comprising:

the clock regeneration circuit according to claim 15; and a phase locked loop circuit including a phase comparator having a first input terminal and a second input terminal, a loop filter configured to smooth an output voltage from the phase comparator, a voltage controlled oscillator, and a frequency divider configured to lower frequency of an output signal of the voltage controlled oscillator by a factor of an integer for input to the second input terminal of the phase comparator, the phase locked loop circuit being configured to input an output to the loop filter, the output corresponding to phase difference between a clock signal outputted from the clock regeneration circuit and inputted to the first input terminal and an output signal of the frequency divider inputted to the second input terminal, the frequency synthesizer being configured to output a clock signal synchronized with the clock signal and having a prescribed frequency.

* * * * *